United States Patent
Yeh et al.

(10) Patent No.: US 11,984,378 B2
(45) Date of Patent: May 14, 2024

(54) SEMICONDUCTOR PACKAGE STRUCTURE AND METHOD FOR FORMING THE SAME

(71) Applicant: Taiwan Semiconductor Manufacturing Company, Ltd., Hsinchu (TW)

(72) Inventors: Shu-Shen Yeh, Taoyuan (TW); Po-Yao Lin, Zhudong Township, Hsinchu County (TW); Chin-Hua Wang, New Taipei (TW); Yu-Sheng Lin, Zhubei (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 121 days.

(21) Appl. No.: 17/319,707

(22) Filed: May 13, 2021

(65) Prior Publication Data
US 2022/0367311 A1 Nov. 17, 2022

(51) Int. Cl.
| | |
|---|---|
| H01L 23/367 | (2006.01) |
| H01L 21/48 | (2006.01) |
| H01L 23/00 | (2006.01) |
| H01L 23/31 | (2006.01) |
| H01L 23/498 | (2006.01) |
| H01L 25/065 | (2023.01) |

(52) U.S. Cl.
CPC ...... *H01L 23/3675* (2013.01); *H01L 21/4857* (2013.01); *H01L 21/4882* (2013.01); *H01L 23/3157* (2013.01); *H01L 23/49816* (2013.01); *H01L 23/49822* (2013.01); *H01L 23/49833* (2013.01); *H01L 23/49838* (2013.01); *H01L 24/16* (2013.01); *H01L 24/29* (2013.01); *H01L 24/32* (2013.01); *H01L 24/73* (2013.01); *H01L 25/0655* (2013.01); *H01L 2224/16235* (2013.01); *H01L 2224/29017* (2013.01); *H01L 2224/32225* (2013.01); *H01L 2224/73204* (2013.01); *H01L 2924/1815* (2013.01); *H01L 2924/182* (2013.01); *H01L 2924/3511* (2013.01); *H01L 2924/35121* (2013.01)

(58) Field of Classification Search
CPC ............ H01L 23/3675; H01L 23/3157; H01L 23/49816; H01L 23/49822; H01L 23/49833; H01L 23/49838; H01L 21/4857; H01L 21/4882; H01L 24/16; H01L 24/29; H01L 24/32; H01L 24/73
USPC .................................................. 257/712, 713
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |

(Continued)

*Primary Examiner* — Jasmine J Clark
(74) *Attorney, Agent, or Firm* — Birch, Stewart, Kolasch & Birch, LLP

(57) ABSTRACT

A semiconductor package structure includes an interposer substrate formed over a package substrate. The structure also includes a die disposed over the interposer substrate. The structure also includes a first heat spreader disposed over the package substrate. The structure also includes a second heat spreader disposed over the die and connected to the first heat spreader. The coefficient of thermal expansion (CTE) of the first heat spreader and the coefficient of thermal expansion of the second heat spreader are different.

20 Claims, 18 Drawing Sheets

(56) References Cited

U.S. PATENT DOCUMENTS

| | | |
|---|---|---|
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2013/0119528 A1* | 5/2013 | Groothuis .......... H01L 23/3675 257/777 |

* cited by examiner

SEMICONDUCTOR PACKAGE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

A chip package not only provides protection for semiconductor devices from environmental contaminants, but also provides a connection interface for the semiconductor devices packaged therein. Smaller package structures, which utilize less area or are lower in height, have been developed to package the semiconductor devices.

New packaging technologies have been developed to further improve the density and functionalities of dies. These relatively new types of packaging technologies for dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
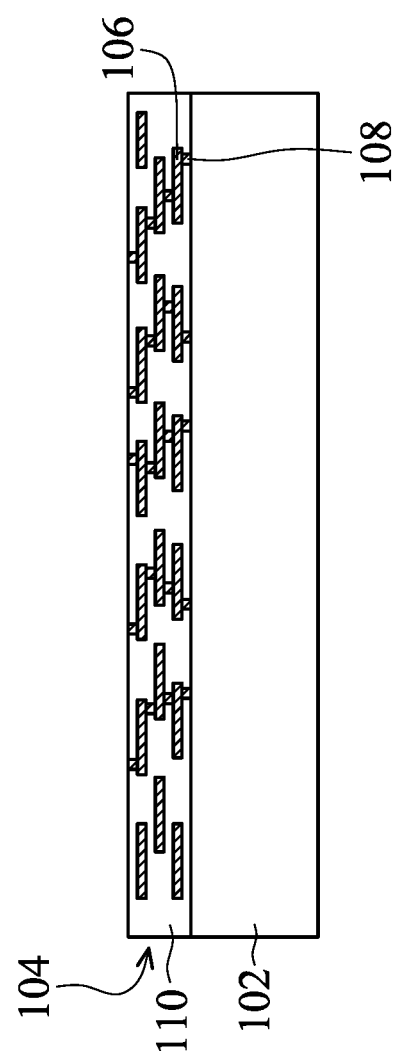
FIGS. 1A-1F are cross-sectional representations of various stages of forming a semiconductor package structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a semiconductor package structure are provided. The method for forming the semiconductor package structure may include disposing discrete heat spreaders with materials of different coefficients of thermal expansion (CTE). Therefore, stress between dies may be reduced, and the delaminate risk between the die and the underfill layer may also be reduced.

FIGS. 1A-1F are cross-sectional representations of various stages of forming a semiconductor package structure 10a, in accordance with some embodiments of the disclosure. A carrier substrate 102 is provided, as shown in FIG. 1A in accordance with some embodiments. The carrier substrate 102 may provide temporary mechanical and structural support during subsequent processing steps. The carrier substrate 102 may include glass, silicon, silicon oxide, aluminum oxide, metal, the like, or a combination thereof. The carrier substrate 102 may include a metal frame.

Next, an interposer substrate 104 is formed over the carrier substrate 102, as shown in FIG. 1A in accordance with some embodiments. In some embodiments, the interposer substrate 104 includes multiple redistribution layer structures 106 and via structures 108 formed in dielectric layers 110.

A dielectric layer 110 is formed over the carrier substrate 102, as shown in FIG. 1A in accordance with some embodiments of the disclosure. Trenches are formed in the dielectric layer 110 to expose the carrier substrate 102. The dielectric layer 110 may be made of polybenzoxazole (PBO), benzocyclobutene (BCB), silicone, acrylates, siloxane, or combinations thereof. The dielectric layer 110 may be made of non-organic materials, such as silicon oxide, un-doped silicate glass, silicon oxynitride, solder resist (SR), silicon nitride, HMDS (hexamethyldisilazane). The trenches may be formed by photolithography and etching process. The photolithography process may include photoresist coating (e.g. spin-on coating), soft baking, mask aligning, pattern exposure, post-exposure baking, photoresist development, and rinsing and drying (e.g. hard baking), etc. The etching process may include a dry etching process (e.g., reactive ion etching (RIE), anisotropic plasma etching method), a wet etching process, or a combination thereof.

Afterwards, a via structure 108 is formed in the trenches in the dielectric layer 110, and a redistribution layer structure 106 is formed over the dielectric layer 110, as shown in FIG. 1A in accordance with some embodiments of the disclosure. The via structure 108 and the redistribution layer structure 106 may be made of metal such as copper (Cu), copper alloy, aluminum (Al), aluminum alloy, tungsten (W), tungsten alloy, titanium (Ti), titanium alloy, tantalum (Ta), or tantalum alloy. The via structure 108 and the redistribution layer structure 106 may be formed by plating, electroless plating, sputtering or chemical vapor deposition (CVD). The via structure 108 and the redistribution layer structure 106 may be formed by the same material. The via structure 108 and the redistribution layer structure 106 may be formed at the same time.

As shown in FIG. 1A, the dielectric layers 110, the via structures 108, and the redistribution layer structures 106 are repeated formed over the carrier substrate 102, and the interposer substrate 104 includes multiple via structures 108 and redistribution layer structures 106 in the dielectric layers 110 are formed over the carrier substrate 102. It should be noted that, the number of layers of the dielectric layers 110, the via structures 108, and the redistribution layer structures 106 shown in FIG. 1A is merely an example, and the present disclosure is not limited thereto.

Figure 1B:
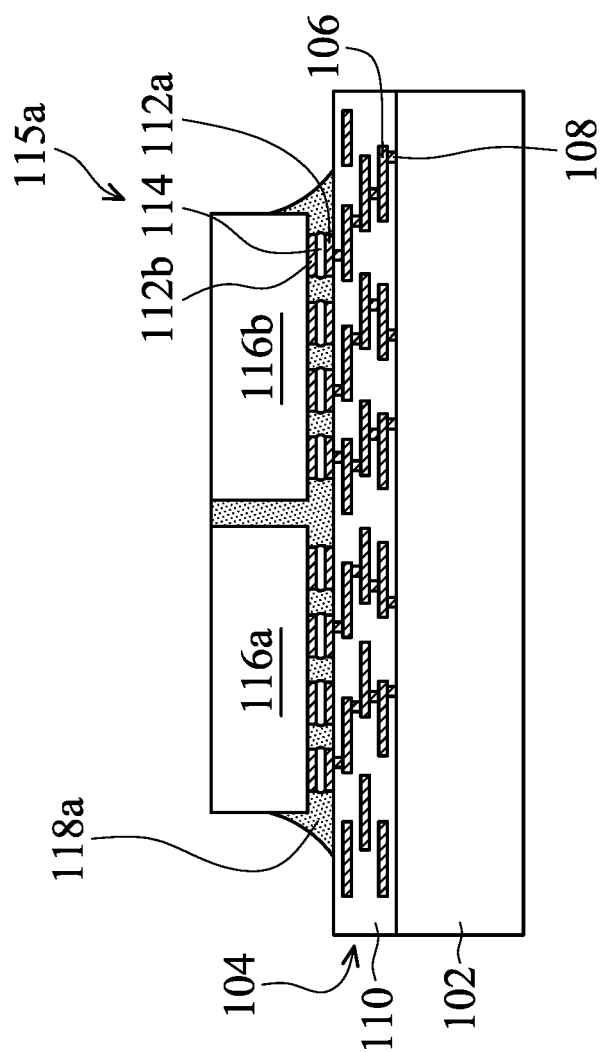

Next, as shown in FIG. 1B, after the interposer substrate 104 is formed, micro-bumps (ubumps) are formed over the interposer substrate 104. First, a conductive layer is formed over the interposer substrate 104 (not shown). The conductive layer may be made of metal material such as aluminum (Al), copper (Cu), tungsten (W), gold (Au), other suitable materials, or a combination thereof. The conductive layer may be deposited by an electroplating process, a sputtering process, another applicable process, or a combination thereof. Afterwards, multiple etching processes may be used to pattern the conductive layer to form conductive pads (not shown).

Next, a passivation layer may be conformally formed over the conductive pads and the interposer substrate 104 (not shown). The passivation layer may be made of polymer material such as polyimide, polybenzoxazole (PBO), benzocyclobutene (BCB), silicone, acrylates, siloxane, other suitable materials, or a combination thereof. The passivation layer may also include non-organic materials such as silicon oxide, un-doped silicate glass, silicon oxynitride, solder resist (SR), silicon nitride, silicon carbide, hexamethyldisilazane (HMDS), other suitable materials, or a combination thereof. The passivation layer may be deposited by a chemical vapor deposition (CVD) process or a spin-on coating process.

Next, the passivation layer may be patterned to form openings exposing the conductive pads (not shown). The openings may be formed by photolithography and etching process. The photolithography process may include photoresist coating (e.g. spin-on coating), soft baking, mask aligning, pattern exposure, post-exposure baking, photoresist development, and rinsing and drying (e.g. hard baking), etc. The etching process may include a dry etching process (e.g., reactive ion etching (RIE), anisotropic plasma etching method), a wet etching process, or a combination thereof.

Next, first conductive pillars 112a are formed in the opening over the conductive pads over the interposer substrate 104, as shown in FIG. 1B in accordance with some embodiments. The first conductive pillars 112a may include copper, nickel, other conductive material, or a combination thereof. The first conductive pillars 112a may be formed by an electroplating process, an electroless plating process, a sputtering process, a chemical vapor deposition (CVD) process, the like, or a combination thereof.

A solder element 114 is formed over the first conductive pillars 112a as shown in FIG. 1B in accordance with some embodiments. The solder element 114 may be made of Sn, Ag, Au, other suitable conductive materials, or a combination thereof.

Next, second conductive pillars 112b are formed under a first die 116a and a second die 116b, and the first die 116a and the second die 116b are placed over the conductive pillars 112a/112b over the interposer substrate 104 as shown in FIG. 1B in accordance with some embodiments. The first die 116a and the second die 116b may be jointed to the interposer substrate 104 by the first conductive pillars 112a, the second conductive pillars 112b, and the solder element 114 between the first conductive pillars 112a and the second conductive pillars 112b. The first conductive pillars 112a, the second conductive pillars 112b, and the solder element 114 may be referred as a first electrical connector 115a, such as the micro-bump (ubump) structure. The first die 116a and the second die 116b may be mounted over and in contact with the first electrical connector 115a. The dies 116a and 116b may be placed over the interposer substrate 104 by a pick-and-place machine process.

The dies 116a/116b may be application-specific integrated circuit (ASIC) die, system on integrated circuit (SoIC) die, high bandwidth memory (HBM) die, dummy die, or the like. The first die 116a and the second die 116b may be the same with the same function. The first die 116*a* and the second die 116*b* may be different dies with different functions.

It should be noted that the number of the dies 116*a*/116*b* is merely an example, and the present disclosure is not limited thereto, depending on the demands of the application. In some embodiments, the height of the first die 116*a* and the second die 116*b* are substantially the same. In some embodiments, the top surface of the first die 116*a* is level with the top surface of the second die 116*b*. Therefore, it may be easier for subsequently grinding process on the first die 116*a* and the second die 116*b*.

Afterwards, a first underfill layer 118*a* is filled between the interposer substrate 104 and the dies 116*a* and 116*b* as shown in FIG. 1B in accordance with some embodiments. The first underfill layer 118*a* may include an underfill material, such as epoxy resin, a polymer material, or a filler material. The first underfill layer 118*a* may provide mechanical support and electrical isolation to the first electrical connector 115*a*, and protection to the active circuitry from the environment. The first underfill layer 118*a* may be formed by a capillary flow process. The first underfill layer 118*a* may have an upwardly tapered trapezoid shapes in a cross-sectional view.

Next, the first underfill layer 118*a* is cured in accordance with some embodiments (not shown). The first underfill layer 118*a* may be cured by a thermal curing process, an infrared (IR) energy curing process, a UV curing process, or a combination thereof.

Figure 1C:
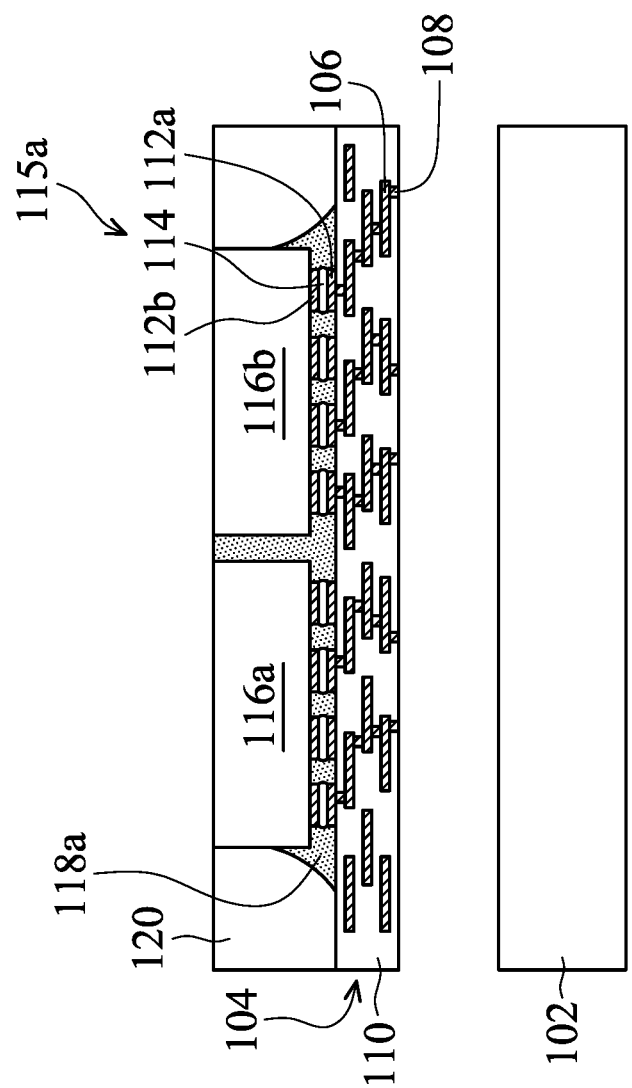

Afterwards, an encapsulating layer 120 may be formed covering the first die 116*a* and the second die 116*b* (not shown). The encapsulating layer 120 surrounds the first underfill layer 118*a*, as shown in FIG. 1C in accordance with some embodiments. The encapsulating layer 120 may be a molding compound layer, including an epoxy-based resin with fillers dispersed therein. The fillers may include insulating fibers, insulating particles, other suitable elements, or a combination thereof. The encapsulating layer 120 may be deposited using a molding process.

After the encapsulating layer 120 is formed, the encapsulating layer 120 may be cured. The processes for curing the encapsulating layer 120 may be the same as, or similar to, the curing process after forming the first underfill layer 118*a*. For the purpose of brevity, the descriptions of these processes are not repeated herein.

Next, a planarization process is performed on the encapsulating layer 120, as shown in FIG. 1C in accordance with some embodiments. After the planarization process, the top surface of the first die 116*a* and the second die 116*b* and the top surfaces of the first underfill layer 118*a* and the encapsulating layer 120 are exposed. The planarization process may include a grinding process, a chemical mechanical polishing (CMP) process, a dry polishing process, an etching process, one or more other applicable processes, or a combination thereof.

Figure 1D:
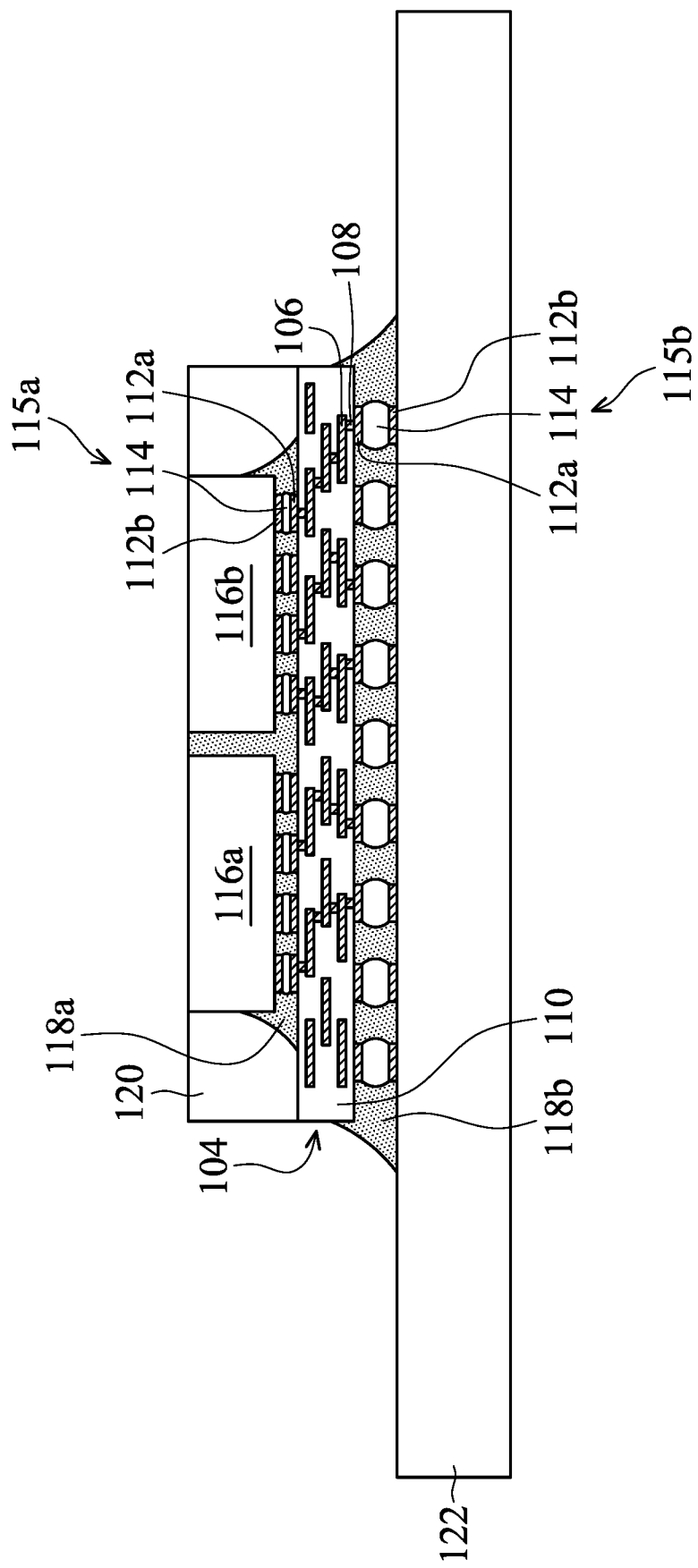

Afterwards, the carrier substrate 102 may be removed, as shown in FIG. 1C, in accordance with some embodiments of the disclosure. The remaining structure of FIG. 1C is disposed over a package substrate 122, as shown in FIG. 1D, in accordance with some embodiments of the disclosure. The package substrate 122 may provide electrical connection between semiconductor devices packaged in the package structure and an external electronic device. The package substrate 122 may be a core or may be a core-less substrate. The package substrate 122 may be a printed circuit board (PCB), a ceramic substrate, or another suitable package substrate.

The interposer substrate 104 is bonded to the package substrate 122 by the second electric connectors 115*b*, as shown in FIG. 1D, in accordance with some embodiments of the disclosure. The second electric connectors 115*b* may be micro-bump (ubump) structures. The second electric connector 115*b* may include the first conductive pillars 112*a*, the second conductive pillars 112*b*, and the solder element 114 between the first conductive pillars 112*a* and the second conductive pillars 112*b*. The first conductive pillars 112*a* may be formed under the interposer substrate 104, and the second conductive pillars 112*b* may be formed over the package substrate 122. The second electric connectors 115*b* provide electrical connection between the interposer substrate 104 and the package substrate 122. The forming processes and material for forming the second electric connector 115*b* may be the same as, or similar to, those used when forming the first electric connector 115*a*. For the purpose of brevity, the descriptions of these processes are not repeated herein.

Next, a second underfill layer 118*b* is formed between the interposer substrate 104 and the package substrate 122 as shown in FIG. 1D in accordance with some embodiments. The second underfill layer 118*b* may surround the second electric connectors 115*b*. The second underfill layer 118*b* may protect the second electric connectors 115*b*, and enhances the connection between the interposer substrate 104 and the package substrate 122. The forming processes and material for forming the second underfill layer 118*b* may be the same as, or similar to, those used when forming the first underfill layer 118*a*. For the purpose of brevity, the descriptions of these processes are not repeated herein.

Figure 1E:
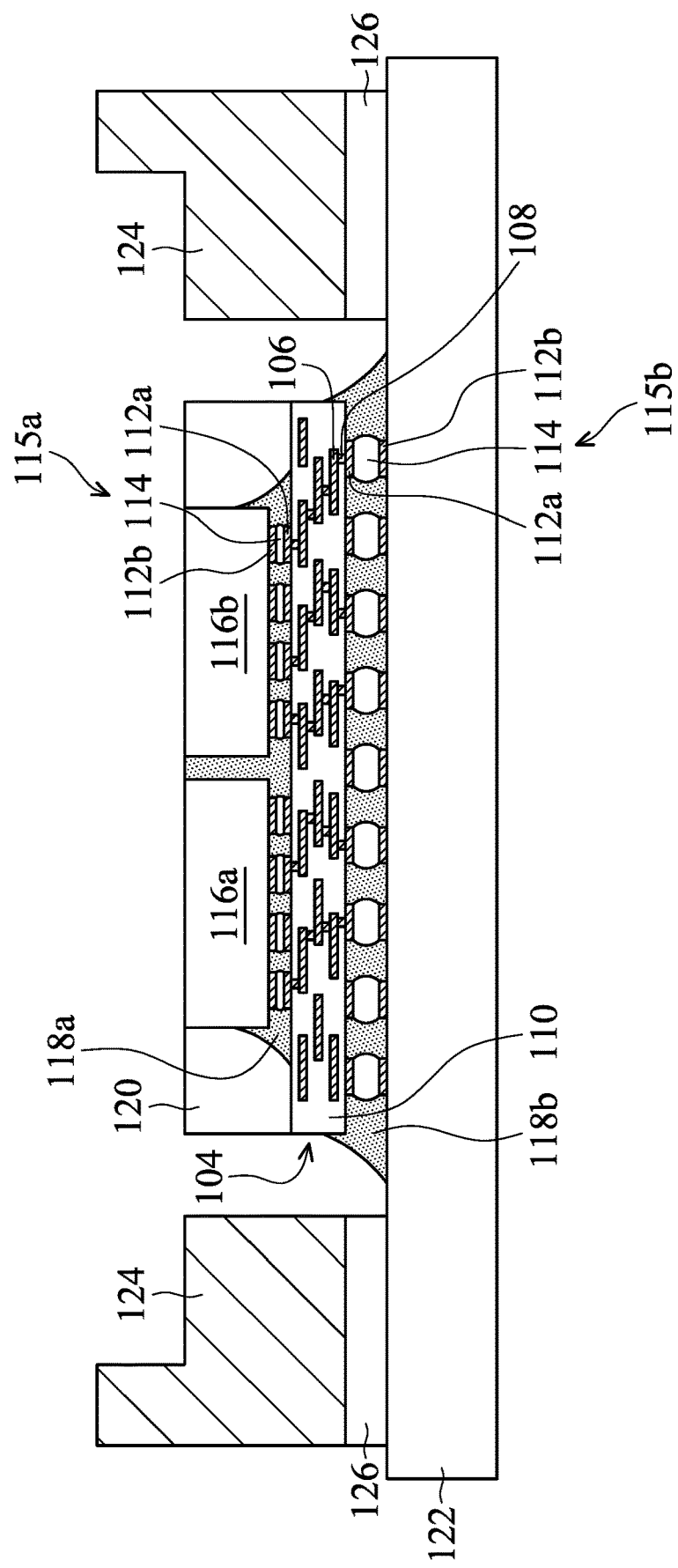

Next, a first heat spreader 124 is formed over the package substrate 122 with an adhesive layer 126 between the first heat spreader 124 and the package substrate 122, as shown in FIG. 1E in accordance with some embodiments. The first heat spreader 124 may be made of metals and/or metal alloys such as aluminum (Al), copper (Cu), nickel (Ni), cobalt (Co), stainless steel, stainless steel/Ni, the like, or a combination thereof. The first heat spreader 124 may also be made of a composite material, such as alloy 42, silicon carbide, aluminum nitride, graphite, the like, or a combination thereof. In some embodiments, the first heat spreader 124 is made of alloy 42.

In some embodiments, the first heat spreader 124 has a coefficient of thermal expansion (CTE) in a range of about 4E-6/K to about 7E-6/K. In some embodiments, the coefficient of thermal expansion of the first heat spreader 124 is greater than the coefficient of thermal expansion of the dies 116*a*/116*b*.

The adhesive layer 126 may have a better adhering ability, allowing the first heat spreader 124 attached to the package substrate 122. The adhesive layer 126 may be made of epoxy, silicon resin, die attach film (DAF), the like, or a combination thereof. In some embodiments, the adhesive layer 126 may be applied to the bottom surface of the first heat spreader 124 or may be applied over the top surface of the package substrate 122. In some embodiments, the adhesive layer 126 is in direct contact with the first heat spreader 124 and the second heat spreader 130.

Figure 1F:
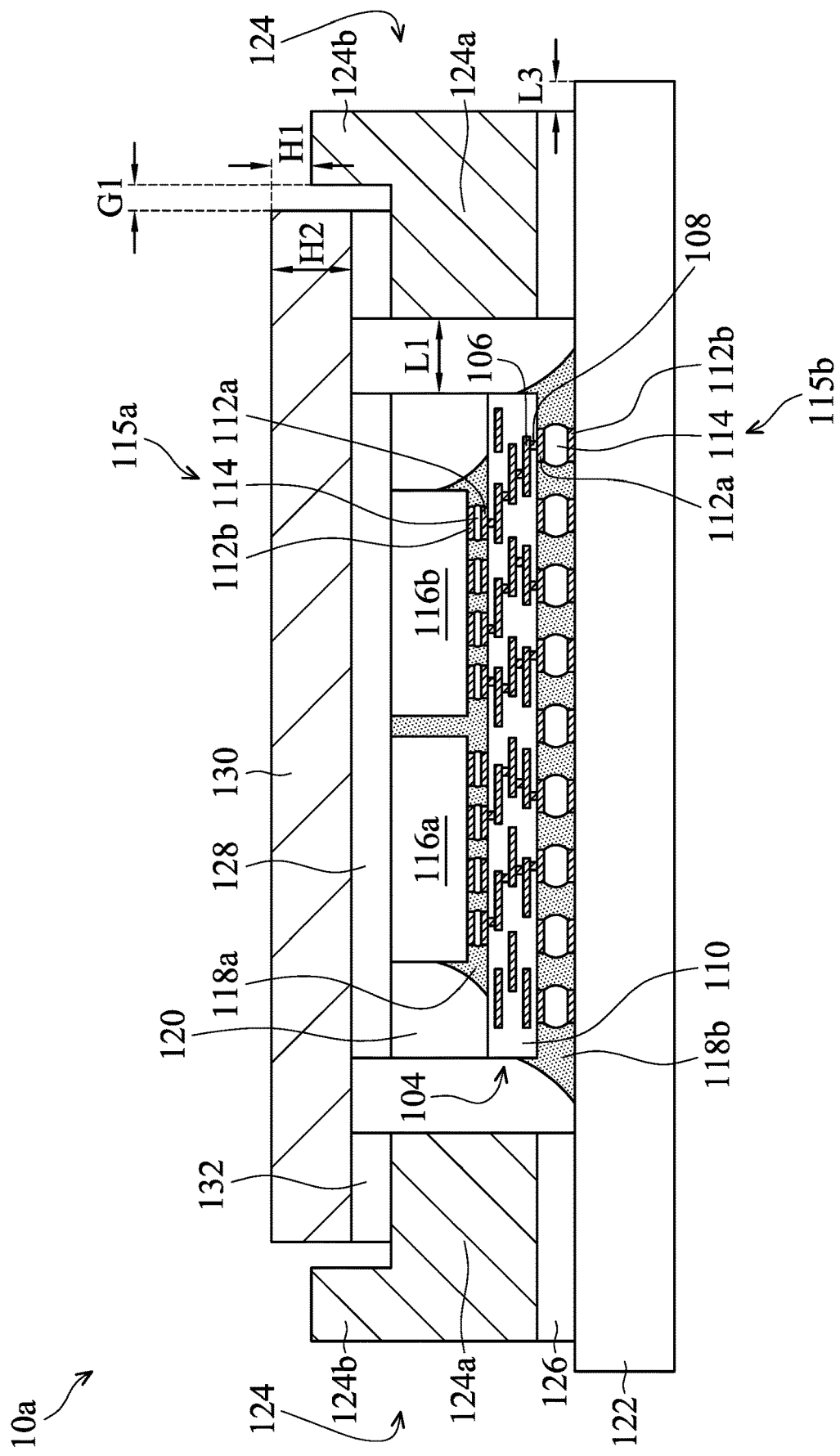

Next, a thermal interface material (TIM) structure 128 is formed covering the dies 116*a*/116*b* as shown in FIG. 1F in accordance with some embodiments. In some embodiments, the TIM structure 128 covers the top surfaces of the first underfill layer 118*a* and the encapsulating layer 120. The TIM structure 128 may be a thermally conductive and electrically insulating material, such as an epoxy mixed with a metal like silver, gold, or a combination thereof. In some embodiments, the top surfaces of the dies 116a/116b are in direct contact with the TIM structure 128. Therefore, the heat generated in the semiconductor package structure may be well conducted to the subsequently formed heat-dissipating structure.

Next, a second heat spreader 130 is formed over the first heat spreader 124 with an adhesive layer 132 between the first heat spreader 124 and the second heat spreader 130, as shown in FIG. 1F in accordance with some embodiments. In some embodiments, the second heat spreader 130 is formed over the dies 116a/116b with the TIM structure 128 between the second heat spreader 130 and the dies 116a/116b. In some embodiments as shown in FIG. 1F, the bottom surface of the second heat spreader 130 is higher than the top surface of the dies 116a/116b. In some embodiments, a sidewall of the second heat spreader 130 is between opposite sidewalls of the first heat spreader 124. The second heat spreader 130 may be referred as the top heat spreader.

The second heat spreader 130 may be made of metals and/or metal alloys such as copper (Cu), aluminum (Al), nickel (Ni), cobalt (Co), stainless steel, stainless steel/Ni, the like, or a combination thereof. The second heat spreader 130 may also be made of a composite material, such as silver diamond, silicon carbide, aluminum nitride, graphite, the like, or a combination thereof. In some embodiments, the second heat spreader 130 is made of copper or silver diamond. The second heat spreader 130 may conduct the heat generated in the semiconductor package structure 10a. The second heat spreader 130 may have a high thermal conductivity.

In some embodiments, the second heat spreader 130 and the first heat spreader 124 are made of different materials. In some embodiments, the coefficient of thermal expansion of the second heat spreader 130 is different from the coefficient of thermal expansion of the first heat spreader 124. In some embodiments, the first heat spreader 124 has a coefficient of thermal expansion in a range of about 10E-6/K to about 17 E-6/K.

Since the coefficients of thermal expansion of the second heat spreader 130 and the first heat spreader 124 are different and the second heat spreader 130 and the first heat spreader 124 are discrete heat spreaders, the stress caused by the coefficient of thermal expansion mismatch between the dies 116a/116b and the package substrate 122 may be reduced. Therefore, the stress in the interposer substrate 104 may be reduced.

In some embodiments, the adhesive layer 132 and the adhesive layer 126 are made of the same material. In some embodiments, the adhesive layer 132 is made of electromagnetic interference (EMI) shielding adhesive materials to avoid electromagnetic interference. In some embodiments, the adhesive layer 132 is made of welding material such as metal and solder. The forming processes for forming the adhesive layer 132 may be the same as, or similar to, those used when forming the adhesive layer 126. For the purpose of brevity, the descriptions of these processes are not repeated herein.

In some embodiments as shown in FIG. 1F, the top surface of the adhesive layer 132 is substantially level with the top surface of the TIM structure 128. Therefore, the second heat spreader 130 may be attached to the adhesive layer 132 and the TIM structure 128.

In some embodiments as shown in FIG. 1F, the first heat spreader 124 includes an inner portion 124a and an outer portion 124b. In some embodiments, the top surface of the outer portion 124b of the first heat spreader 124 is higher than the top surface of the inner portion 124a of the first heat spreader 124. In some embodiments, the adhesive layer 132 is formed over the top surface of the inner portion 124a of the first heat spreader 124, and the second heat spreader 130 covers the inner portion 124a of the first heat spreader 124.

In some embodiments as shown in FIG. 1F, the first heat spreader 124 surrounds the interposer substrate 104. In some embodiments, the first heat spreader 124 has an L-shape in the cross-sectional view. In some embodiments, the outer portion 124b of the first heat spreader 124 is thicker than the inner portion 124a of the first heat spreader 124. Thicker outer portion 124b of the first heat spreader 124 may provide more mechanical strength to reduce the stress in the interposer substrate 104.

In some embodiments as shown in FIG. 1F, the sidewall of the outer portion 124b of the first heat spreader 124 is separated from the sidewall of the second heat spreader 130. Therefore, the distance G1 between the sidewall of the outer portion 124b of the first heat spreader 124 and the sidewall of the second heat spreader 130 may be greater than 0 μm. In some embodiments, the distance G1 between the sidewall of the outer portion 124b of the first heat spreader 124 and the sidewall of the second heat spreader 130 is greater than 200 μm.

In some embodiments as shown in FIG. 1F, the distance L3 between the sidewall of the first heat spreader 124 and the edge of the package substrate 122 is greater than 0 μm. Therefore, the misalignment issue may be prevented. In some embodiments, the distance L3 between the sidewall of the first heat spreader 124 and the edge of the package substrate 122 is greater than 200 μm.

In some embodiments as shown in FIG. 1F, the sidewall of the first heat spreader 124 is spaced apart from the interposer substrate 104. In some embodiments, passive devices are formed between the first heat spreader 124 and the interposer substrate 104 (not shown). Therefore, the distance L1 between the sidewall of the first heat spreader 124 and the sidewall of the interposer substrate 104 is greater than 0 μm.

In some embodiments as shown in FIG. 1F, the second heat spreader 130 has a height H2. As shown in FIG. 1F, there is a height difference H1 between the top surfaces of the first heat spreader 124 and the second heat spreader 130. In some embodiments, the height H2 of the second heat spreader 130 is greater than the height difference H1 between the top surfaces of the first heat spreader 124 and the second heat spreader 130. In some embodiments, the ratio of the height difference H1 to the height H2 is in a range of about 0.1 to less than 1.0. If the height difference H1 between the top surfaces of the first heat spreader 124 and the second heat spreader 130 is too great, the stress may not be reduces effectively.

In some embodiments as shown in FIG. 1F, since the first heat spreader 124 has a L-shape in the cross-sectional view, the second heat spreader 130 may be disposed between the outer portion 124b of the first heat spreader 124 more easily. The misalignment between the first heat spreader 124 and the second heat spreader 130 may be prevented.

Figure 9:
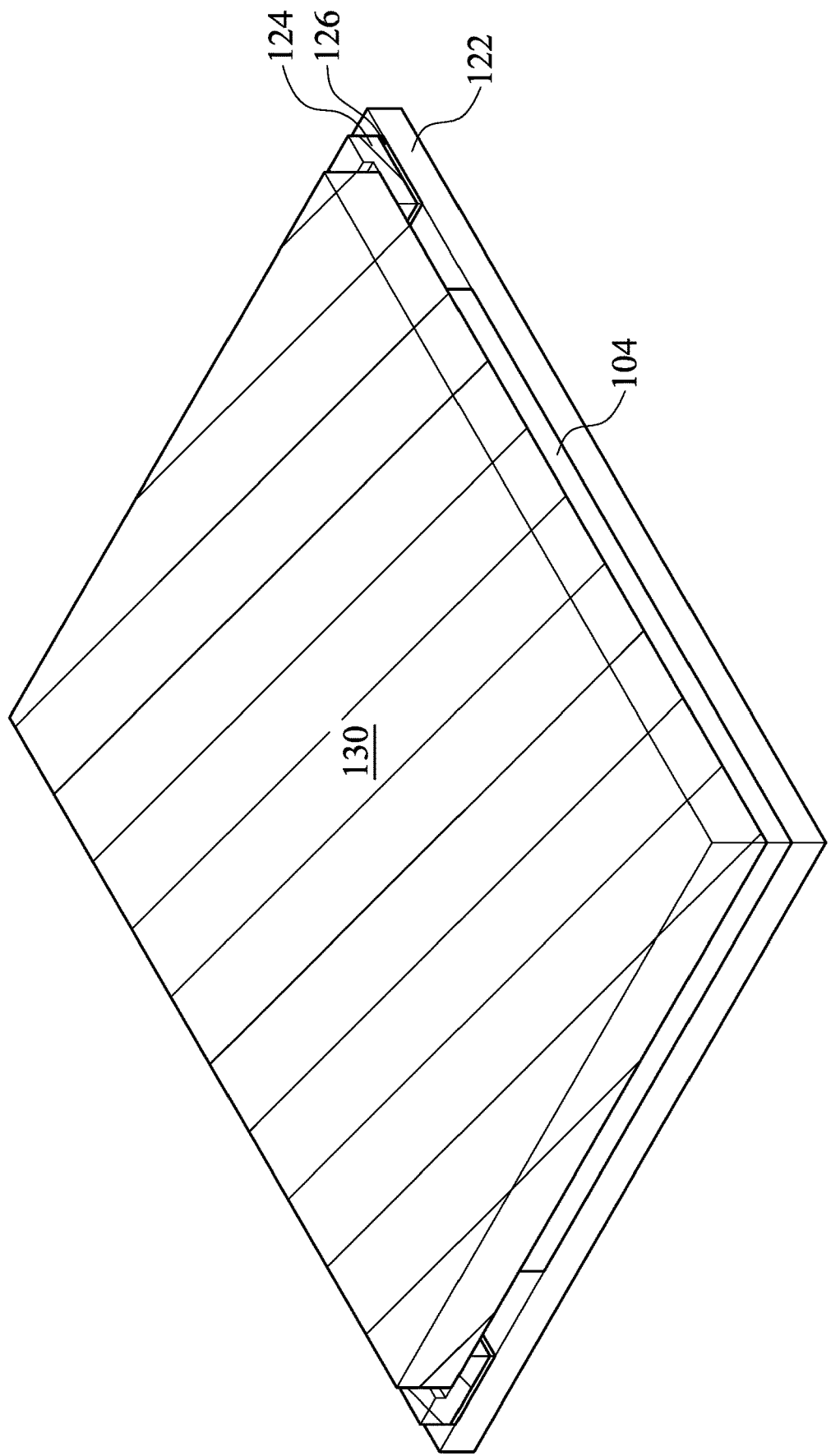
FIG. 9 is a perspective view of a semiconductor package structure, in accordance with some embodiments of the disclosure.
Figure 10:
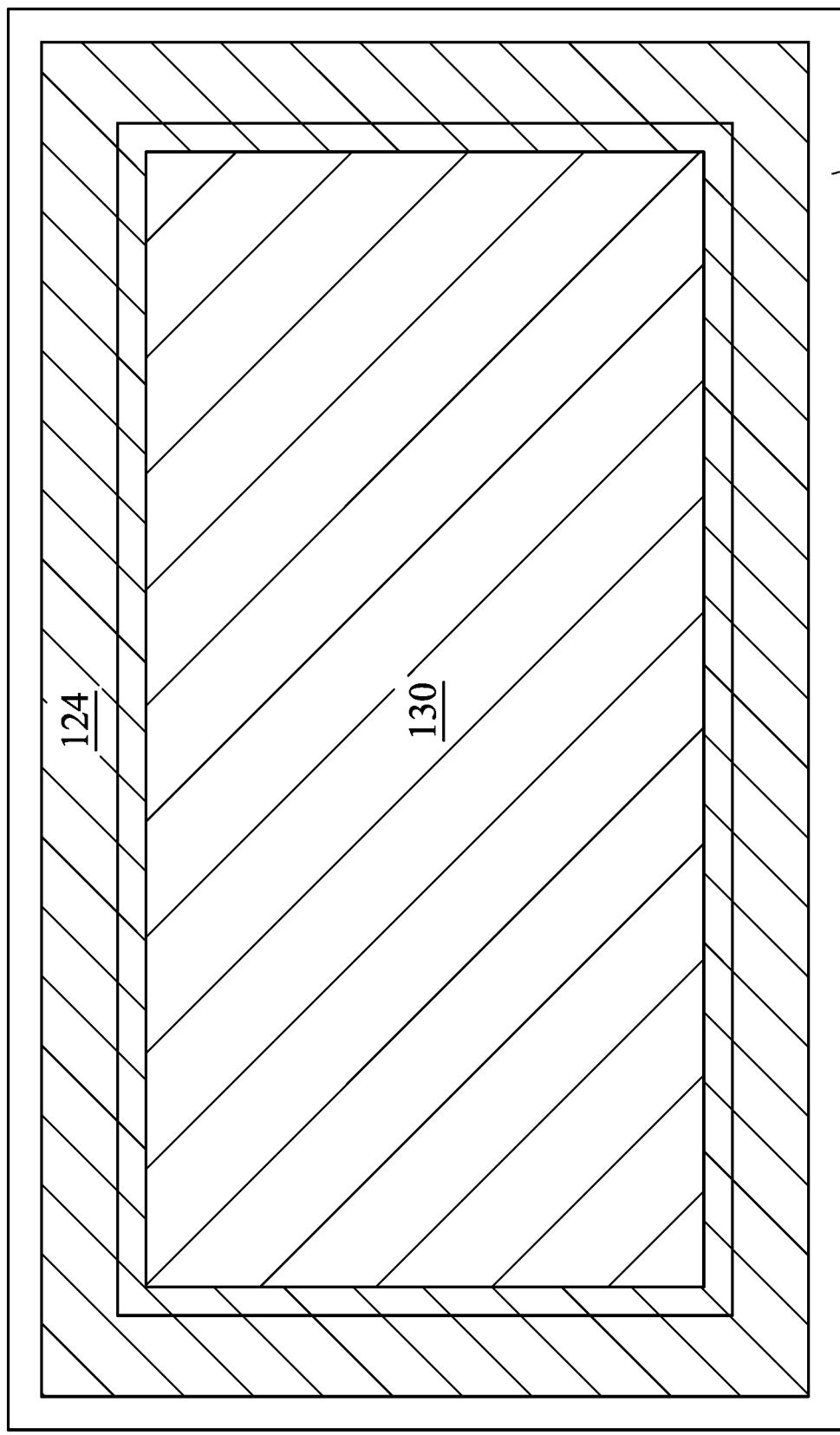
FIG. 10 is a top view of a semiconductor package structure, in accordance with some embodiments of the disclosure.

FIG. 9 is a perspective view of the semiconductor package structure, in accordance with some embodiments of the disclosure. FIG. 10 is a top view of a semiconductor package structure, in accordance with some embodiments of the disclosure. In some embodiments as shown in FIGS. 9 and 10, the first heat spreader 124 surrounds the second heat spreader 130 and the interposer substrate 104 from a top view. In some embodiments, the first heat spreader 124 is in a ring shape surrounding the second heat spreader 130 and the interposer substrate 104 from a top view.

It should be noted that the first heat spreader 124 shown in FIGS. 9 and 10 is merely an example, and the present disclosure is not limited thereto. In some embodiments, the first heat spreader 124 is arranged as discontinuous strips surrounding the second heat spreader 130 and the interposer substrate 104 from a top view.

By disposing discrete first heat spreader 124 and second heat spreader 130 over the dies 116a/116b and the package substrate 122, the stress in the interposer substrate 104 may be reduced. The L-shape first heat spreader 124 may help to prevent misalignment when disposing the second heat spreader 130 over the first heat spreader 124 and the dies 116a/116b. Moreover, the warpage issue may be prevented.

Figure 2:
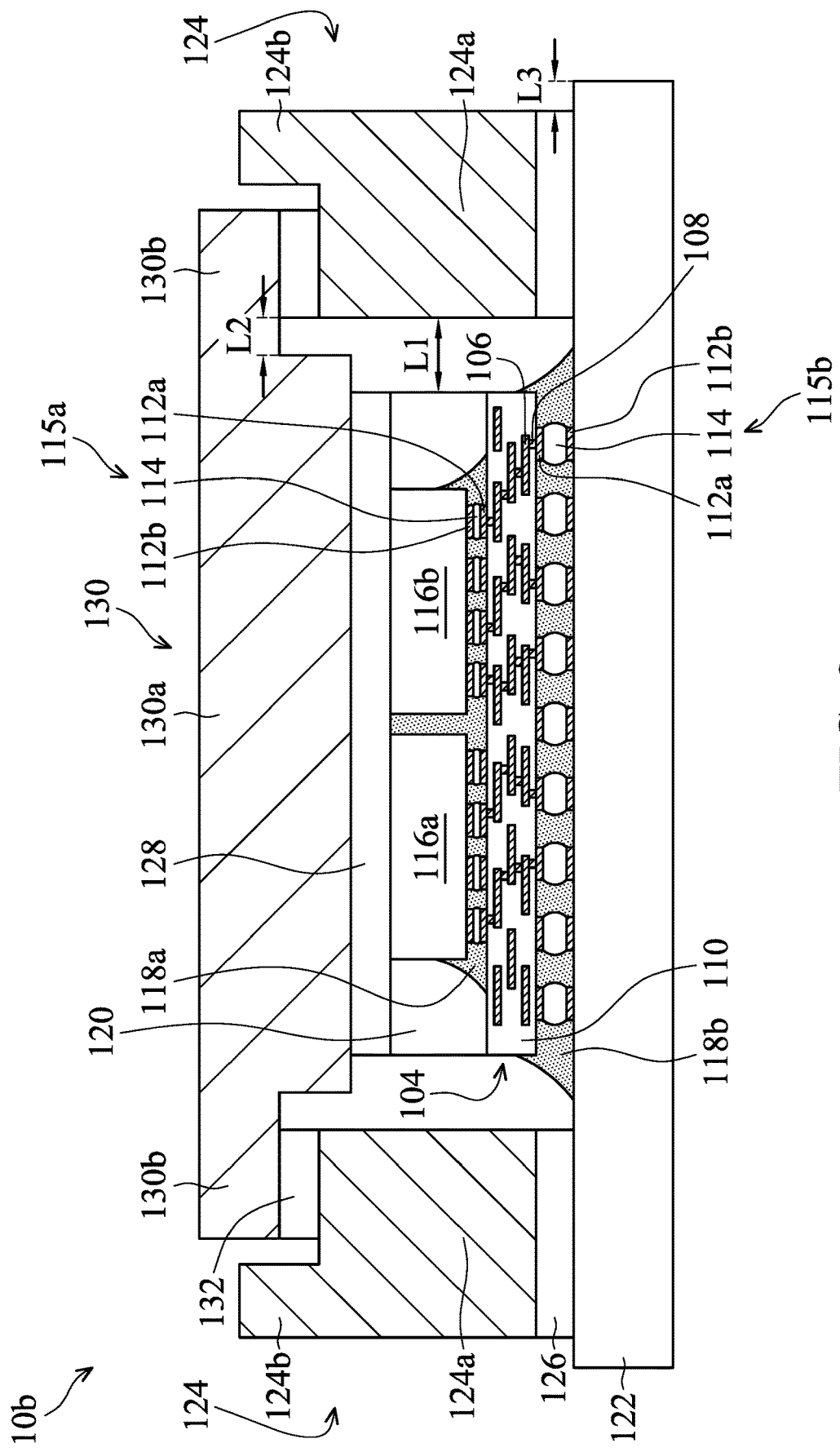
FIG. 2 is a cross-sectional view of a modified semiconductor package structure, in accordance with some embodiments of the disclosure.

Many variations and/or modifications may be made to the embodiments of the disclosure. FIG. 2 is a cross-sectional view of a modified semiconductor package structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 2 in accordance with some embodiments, the second heat spreader 130 has an inner portion 130a and an outer portion 130b, and the bottom surface of the inner portion 130a is lower than the bottom surface of the outer portion 130b.

In some embodiments as shown in FIG. 2, a sidewall of the inner portion 130a of the second heat spreader 130 is separated from the sidewall of the first heat spreader 124. In some embodiments, the distance L2 between the sidewall of the inner portion 130a of the second heat spreader 130 and the sidewall of the first heat spreader 124 is greater than 200 μm. Therefore, the misalignment issue may be prevented.

In some embodiments, the distance L1 between the interposer substrate 104 and the first heat spreader 124 is greater than the distance L2 between the inner portion 130a of the second heat spreader 130 and the sidewall of the first heat spreader 124.

Since the inner portion 130a and the outer portion 130b of the second heat spreader 130 have different thicknesses, the flexibility of modifying the stress in the interposer substrate 104 may be improved.

By disposing discrete first heat spreader 124 and second heat spreader 130 over the dies 116a/116b and the package substrate 122, the stress in the interposer substrate 104 may be reduced. The L-shape first heat spreader 124 may help to prevent misalignment when disposing the second heat spreader 130 over the first heat spreader 124 and the dies 116a/116b. Moreover, the warpage issue may be prevented. With inner portion 130a and outer portion 130b with different thicknesses, there may be more flexibility to modify the stress in the interposer substrate 104.

Figure 3:
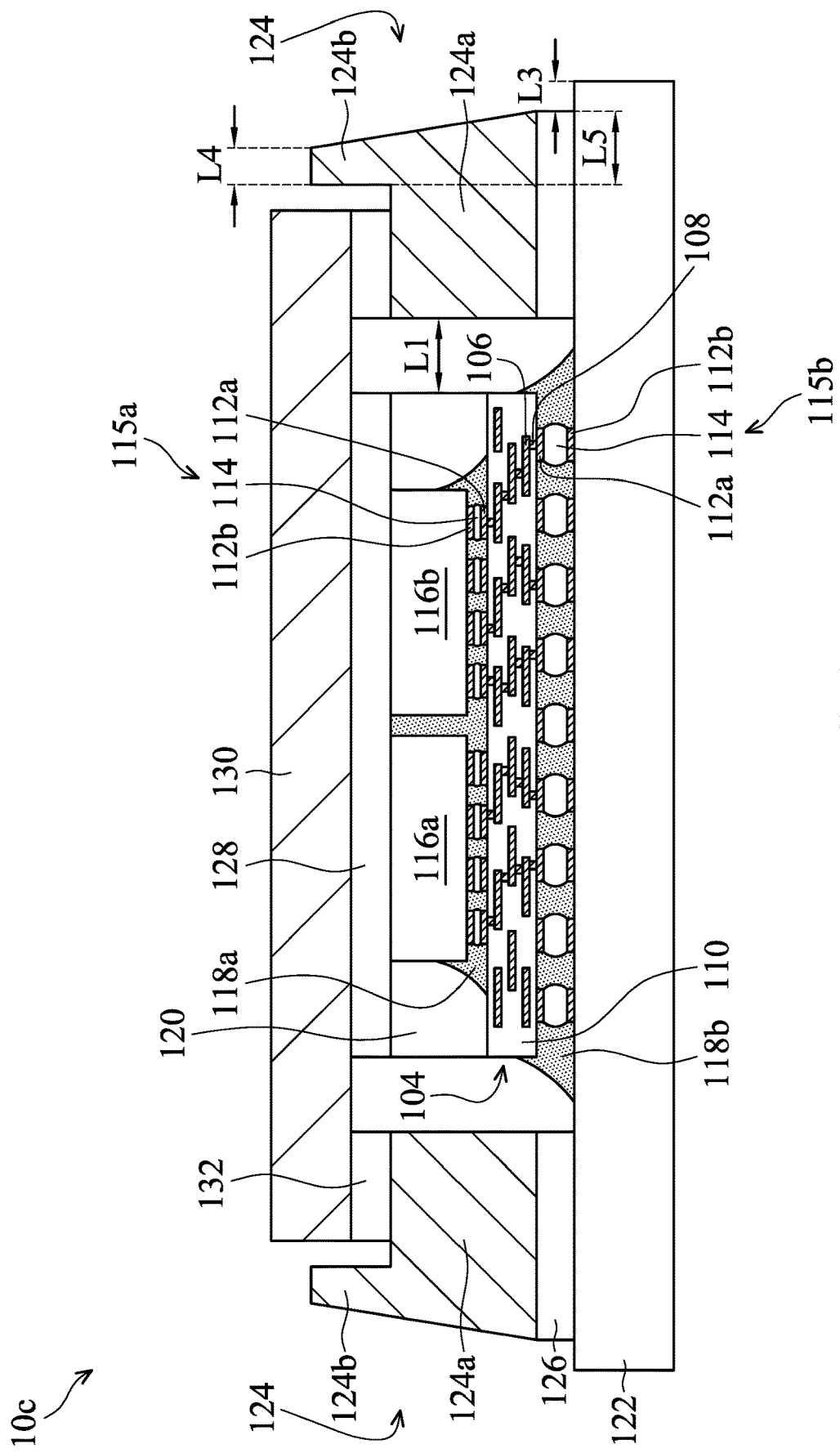
FIG. 3 is a cross-sectional view of a modified semiconductor package structure, in accordance with some embodiments of the disclosure.

Many variations and/or modifications may be made to the embodiments of the disclosure. FIG. 3 is a cross-sectional view of a modified semiconductor package structure 10c, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 3 in accordance with some embodiments, the outer portion 124b of the first heat spreader 124 has a sloped sidewall.

In some embodiments as shown in FIG. 3, the bottom surface of the outer portion 124b of the first heat spreader 124 is wider than the top surface of the outer portion 124b of the first heat spreader 124. In some embodiments as shown in FIG. 3, the bottom surface of the outer portion 124b of the first heat spreader 124 has a width L5, and the top surface of the outer portion 124b of the first heat spreader 124 has a width L4. In some embodiments, the width L4 of the top surface is less than the width L5 of the bottom surface of the outer portion 124b. In some embodiments as shown in FIG. 3, the ratio of the width L4 to the width L5 is in a range of about 0.1 to less than 1.0. With more contact area between the first heat spreader 124 and the package substrate 122, the flexibility of modifying the stress in the interposer substrate 104 may be improved.

By disposing discrete first heat spreader 124 and second heat spreader 130 over the dies 116a/116b and the package substrate 122, the stress in the interposer substrate 104 may be reduced. The L-shape first heat spreader 124 may help to prevent misalignment when disposing the second heat spreader 130 over the first heat spreader 124 and the dies 116a/116b. Moreover, the warpage issue may be prevented. With outer portion 124b having a sloped sidewall, there may be more flexibility to modify the stress in the interposer substrate 104.

Figure 4:
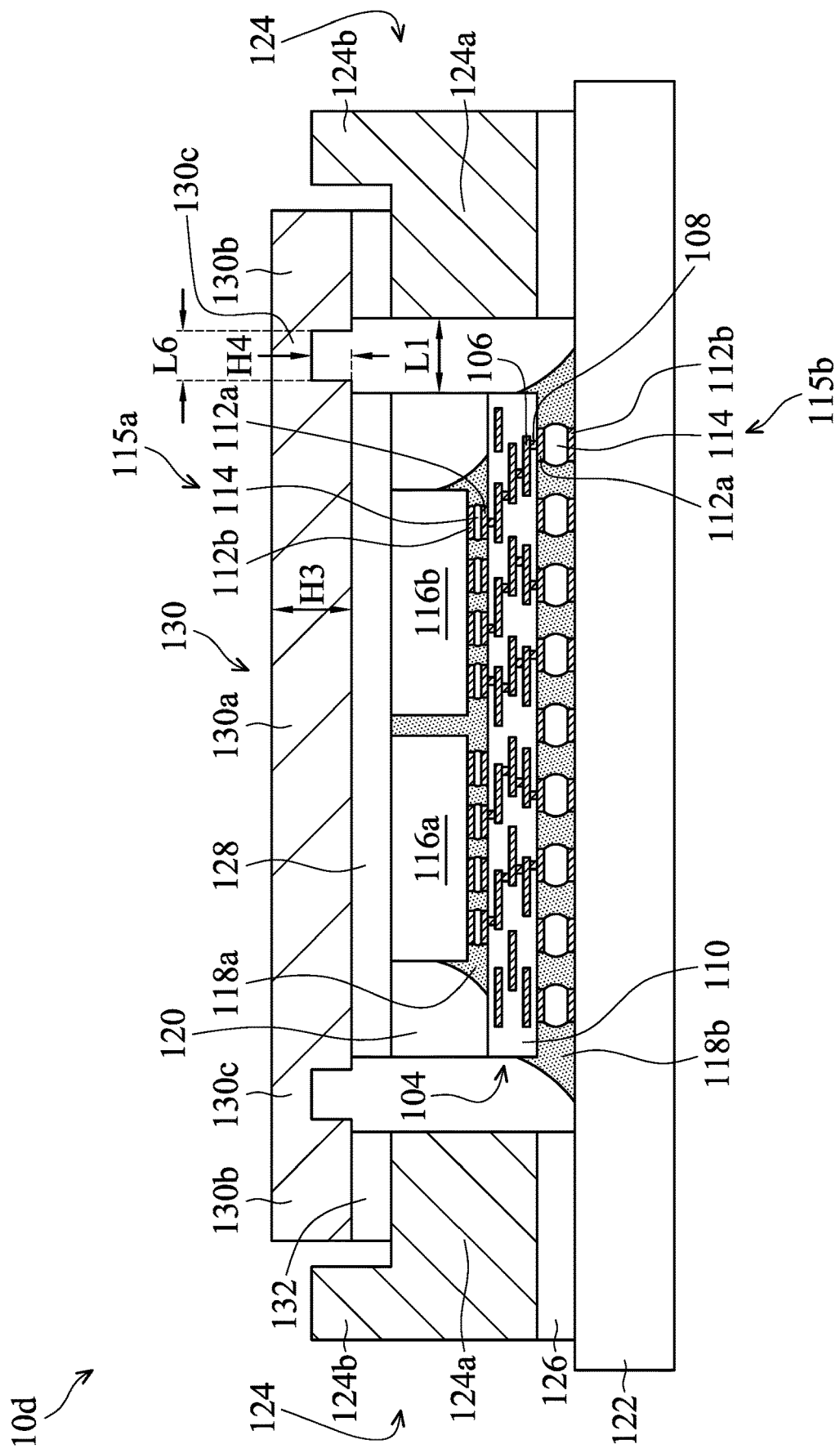
FIG. 4 is a cross-sectional view of a modified semiconductor package structure, in accordance with some embodiments of the disclosure.

Many variations and/or modifications may be made to the embodiments of the disclosure. FIG. 4 is a cross-sectional view of a modified semiconductor package structure 10d, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4 in accordance with some embodiments, the second heat spreader 130 has a thinner middle portion 130c between the inner portion 130a and the outer portion 130b.

In some embodiments, the second heat spreader 130 has an inner portion 130a over the dies 116a/116b, an outer portion 130b over the first heat spreader 124, and a middle portion 130c between the inner portion 130a and the outer portion 130b. With thinner middle portion 130c, the stress caused by the coefficient of thermal expansion difference between the dies 116a/116b and the first heat spreader 124 may be reduced.

In some embodiments, the inner portion 130a and the outer portion 130b have the same thickness H3, and there is a thickness difference H4 between the middle portion 130c and the inner portion 130a. In some embodiments as shown in FIG. 4, the ratio of the thickness difference H4 to the thickness H3 is in a range of about 0.1 to about 1.0. If the thickness difference H4 is too less, the coefficient of thermal expansion difference between the dies 116a/116b and the first heat spreader 124 may cause stress in the interposer substrate 104.

In some embodiments, the middle portion 130c of the second heat spreader 130 has a width L6. In some embodiments, the width L6 is less than the distance L1 between the first heat spreader 124 and the interposer substrate 104. In some embodiments as shown in FIG. 4, the ratio of the width L6 to the distance L1 is in a range of about 0.5 to about 1.0.

By disposing discrete first heat spreader 124 and second heat spreader 130 over the dies 116a/116b and the package substrate 122, the stress in the interposer substrate 104 may be reduced. The L-shape first heat spreader 124 may help to prevent misalignment when disposing the second heat spreader 130 over the first heat spreader 124 and the dies 116a/116b. Moreover, the warpage issue may be prevented. The second heat spreader 130 may have a thinner middle portion 130c, and the stress caused by the coefficient of thermal expansion difference between the dies 116a/116b and the first heat spreader 124 may be reduced.

Figure 5:
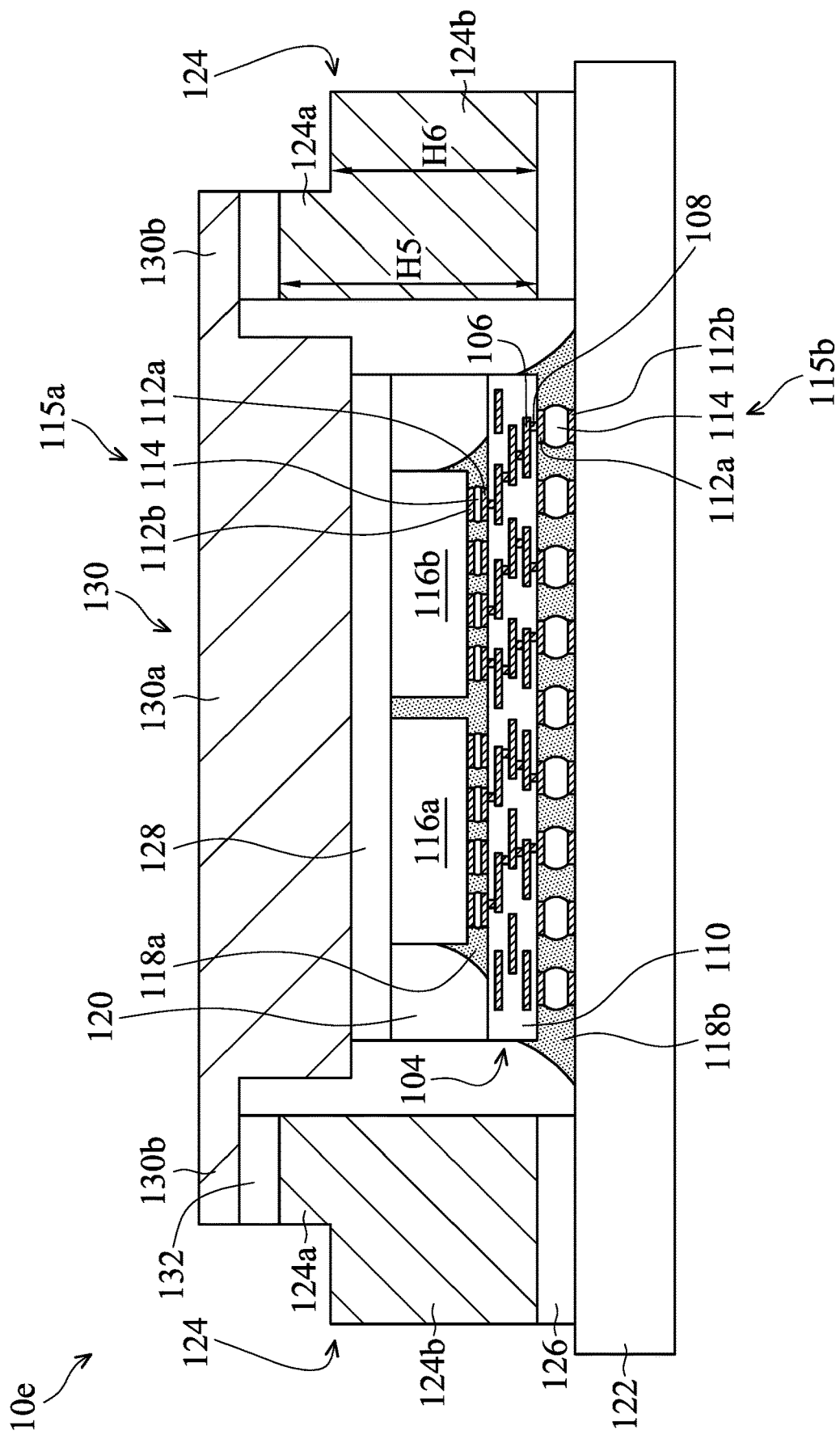
FIG. 5 is a cross-sectional view of a modified semiconductor package structure, in accordance with some embodiments of the disclosure.

Many variations and/or modifications may be made to the embodiments of the disclosure. FIG. 5 is a cross-sectional view of a modified semiconductor package structure 10e, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 5 in accordance with some embodiments, the outer portion 124b of the first heat spreader 124 is thinner than the inner portion 124a of the first heat spreader 124.

In some embodiments as shown in FIG. 5, the inner portion 130a of the second heat spreader 130 is thicker than the outer portion 130b of the second heat spreader 130.

In some embodiments, the outer portion 124b of the first heat spreader 124 has a thickness H6, and the inner portion 124a of the first heat spreader 124 has a thickness H5. In some embodiments as shown in FIG. 5, the ratio of the thickness H6 to the thickness H5 is in a range of about 0.2 to less than 1.0. The thickness H6 of the outer portion 124b may help to modify the mechanical strength and reduce the coefficient of thermal expansion mismatch between the package substrate 122 and the first heat spreader 124.

It should be noted that the first heat spreader 124 shown in FIG. 5 is merely an example, and the present disclosure is not limited thereto. In some embodiments, the top surface of the outer portion 124b of the first heat spreader 124 is higher than the bottom surface of the inner portion 130a of the second heat spreader 130. The top surface of the outer portion 124b of the first heat spreader 124 may be higher than or level with the bottom surface of the inner portion 130a of the second heat spreader 130.

By disposing discrete first heat spreader 124 and second heat spreader 130 over the dies 116a/116b and the package substrate 122, the stress in the interposer substrate 104 may be reduced. The L-shape first heat spreader 124 may help to prevent misalignment when disposing the second heat spreader 130 over the first heat spreader 124 and the dies 116a/116b. Moreover, the warpage issue may be prevented. The outer portion 124b of the first heat spreader 124 is thinner than the inner portion 124a of the first heat spreader 124, the coefficient of thermal expansion mismatch between the package substrate 122 and the first heat spreader 124 may be reduced by modifying the thickness H6 of the outer portion 124b of the first heat spreader 124.

Figure 6:
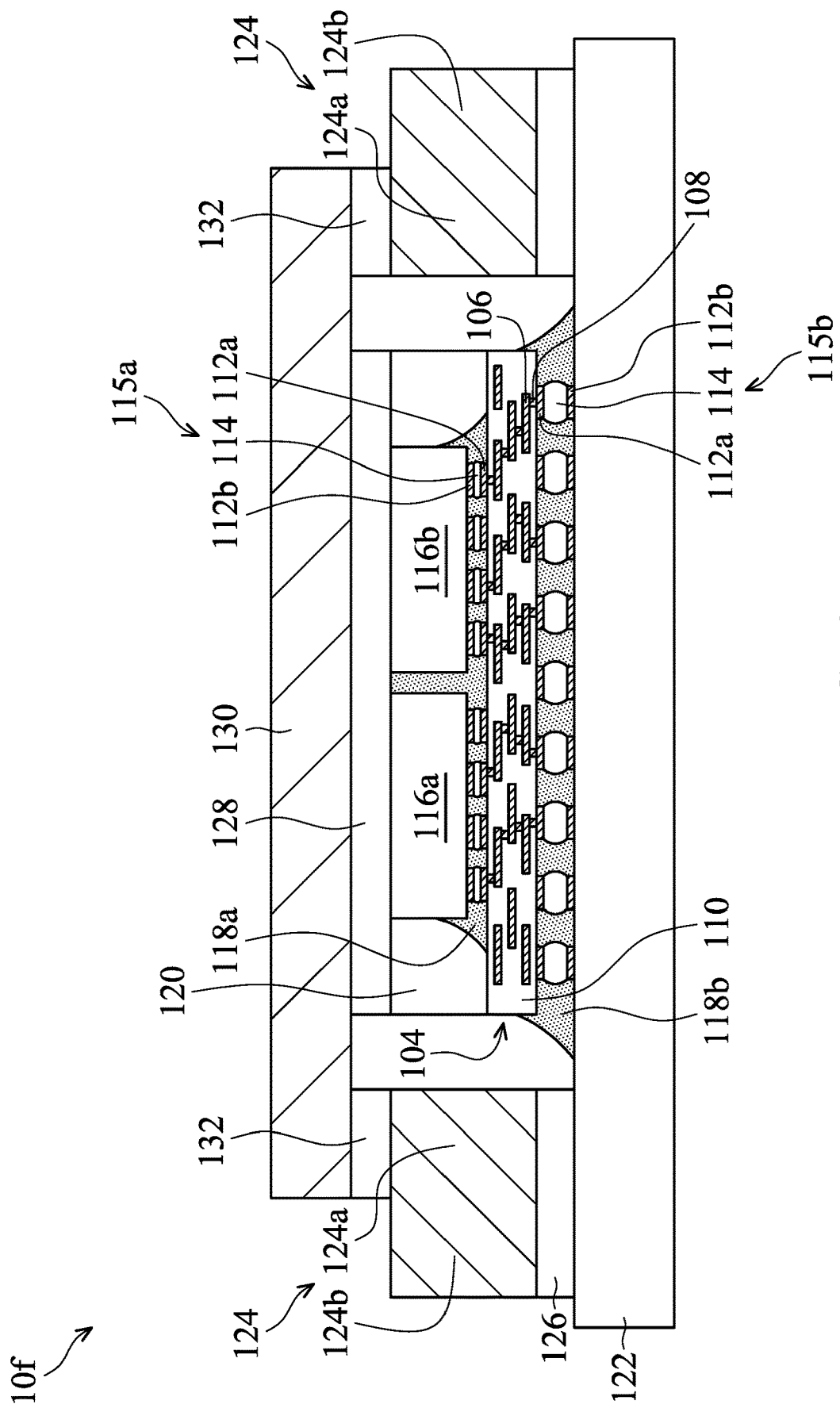
FIG. 6 is a cross-sectional view of a modified semiconductor package structure, in accordance with some embodiments of the disclosure.

Many variations and/or modifications may be made to the embodiments of the disclosure. FIG. 6 is a cross-sectional view of a modified semiconductor package structure 10f, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 6 in accordance with some embodiments, the top surface of the outer portion 124b of the first heat spreader 124 is substantially level with the top surface of the inner portion 124a of the first heat spreader 124.

In some embodiments, the inner portion 124a of the first heat spreader 124 is covered by the second heat spreader 130 while the outer portion 124b is not. In some embodiments, the top surface of the outer portion 124b is lower than the bottom surface of the second heat spreader 130. In some embodiments, the outer portion 124b of the first heat spreader 124 has a rectangle shape in the cross-sectional view. With thinner first heat spreader 124, the mechanical strength may be lower, and the stress may be reduced.

By disposing discrete first heat spreader 124 and second heat spreader 130 over the dies 116a/116b and the package substrate 122, the stress in the interposer substrate 104 may be reduced. The L-shape first heat spreader 124 may help to prevent misalignment when disposing the second heat spreader 130 over the first heat spreader 124 and the dies 116a/116b. Moreover, the warpage issue may be prevented. The inner portion 124a and the outer portion 124b of the first heat spreader 124 may have the same thickness. Therefore, the mechanical strength may be lower, and the stress may be reduced.

Figure 7A:
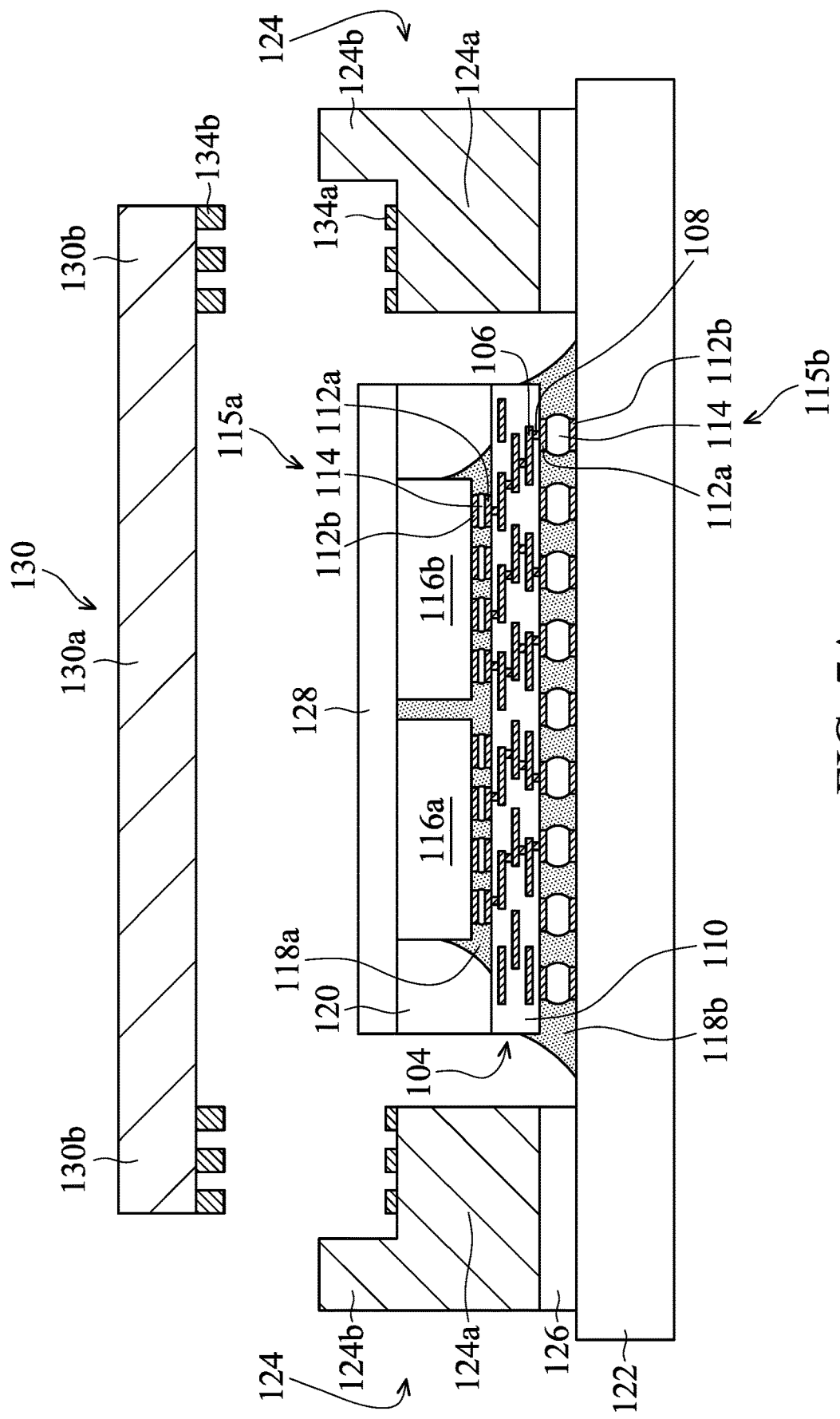
FIGS. 7A-7B are cross-sectional representations of various stages of forming a modified semiconductor package structure, in accordance with some embodiments of the disclosure.
Figure 7B:
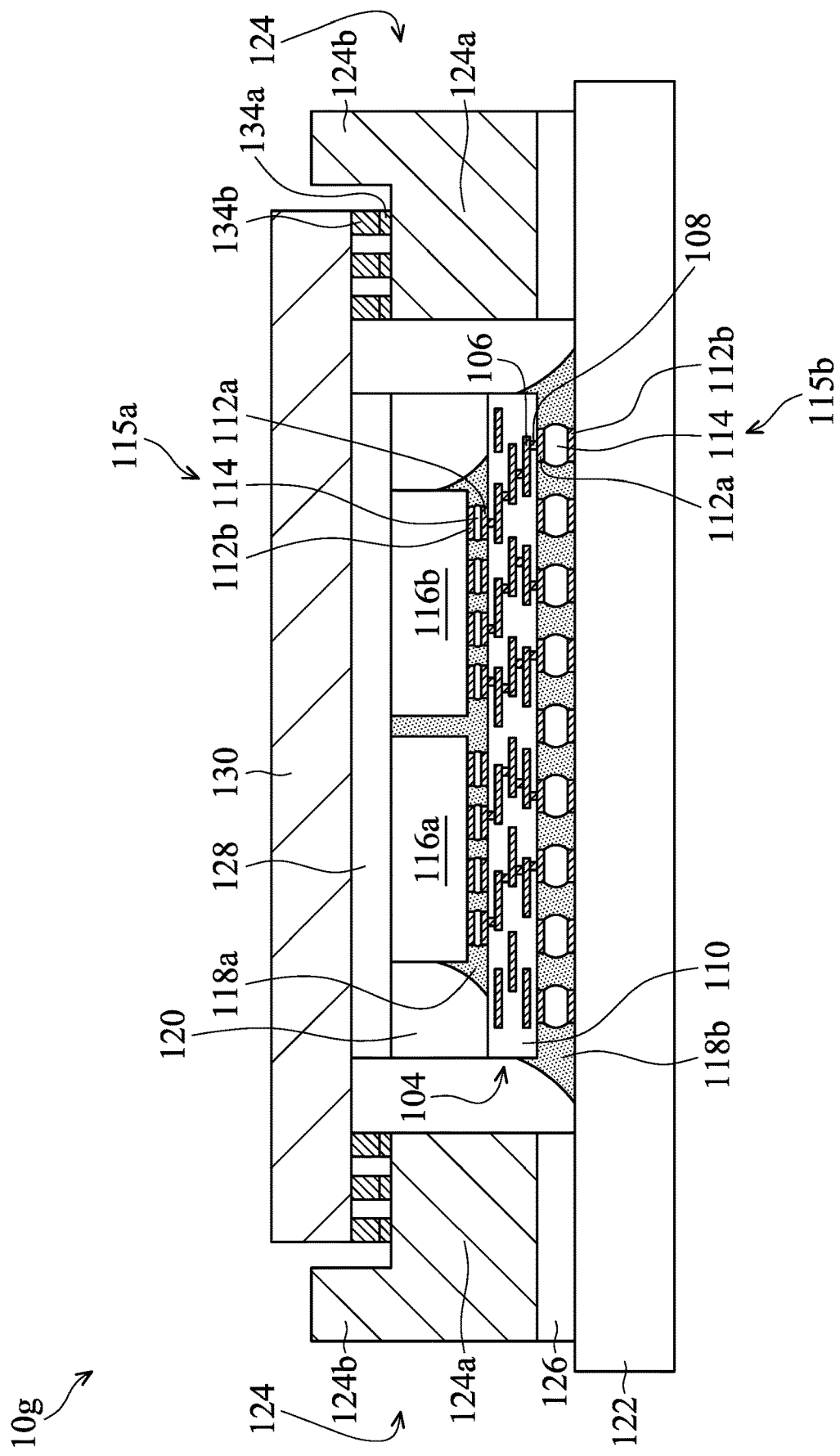

Many variations and/or modifications may be made to the embodiments of the disclosure. FIGS. 7A-7B are cross-sectional representations of various stages of forming the semiconductor package structure 10g, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 7A in accordance with some embodiments, the first heat spreader 124 and the second heat spreader 130 are bonded with each other by the bonding pad structures 134a/134b.

In some embodiments, first bonding pad structures 134a are formed over the inner portion 124a of the first heat spreader 124, and the second bonding pad structures 134b are formed under the outer portion 130b of the second heat spreader 130. In some embodiments as shown in FIG. 7A, the first bonding pad structures 134a is vertically aligned with the second bonding pad structures 134b.

In some embodiments, the first bonding pad structures 134a and the second bonding pads are bonded by a solder element (not shown). The solder element may be made of Sn, Ag, Au, other suitable conductive materials, or a combination thereof.

In some embodiments, the bonding pad structures 134a/134b may include copper, gold, other suitable materials, or a combination thereof. With copper bonding pads, the cost for production may be reduced. With gold bonding pads, the semiconductor package structure may be thinner.

Next, the first bonding pad structures 134a and the second bonding pad structures 134b are bonded with each other, as shown in FIG. 7B in accordance with some embodiments. Therefore, the first heat spreader 124 and the second heat spreader 130 are bonded with each other.

By disposing discrete first heat spreader 124 and second heat spreader 130 over the dies 116a/116b and the package substrate 122, the stress in the interposer substrate 104 may be reduced. The L-shape first heat spreader 124 may help to prevent misalignment when disposing the second heat spreader 130 over the first heat spreader 124 and the dies 116a/116b. Moreover, the warpage issue may be prevented. The first heat spreader 124 and the second heat spreader 130 may be attached by the bonding pad structures 134a/134b.

Figure 8A:
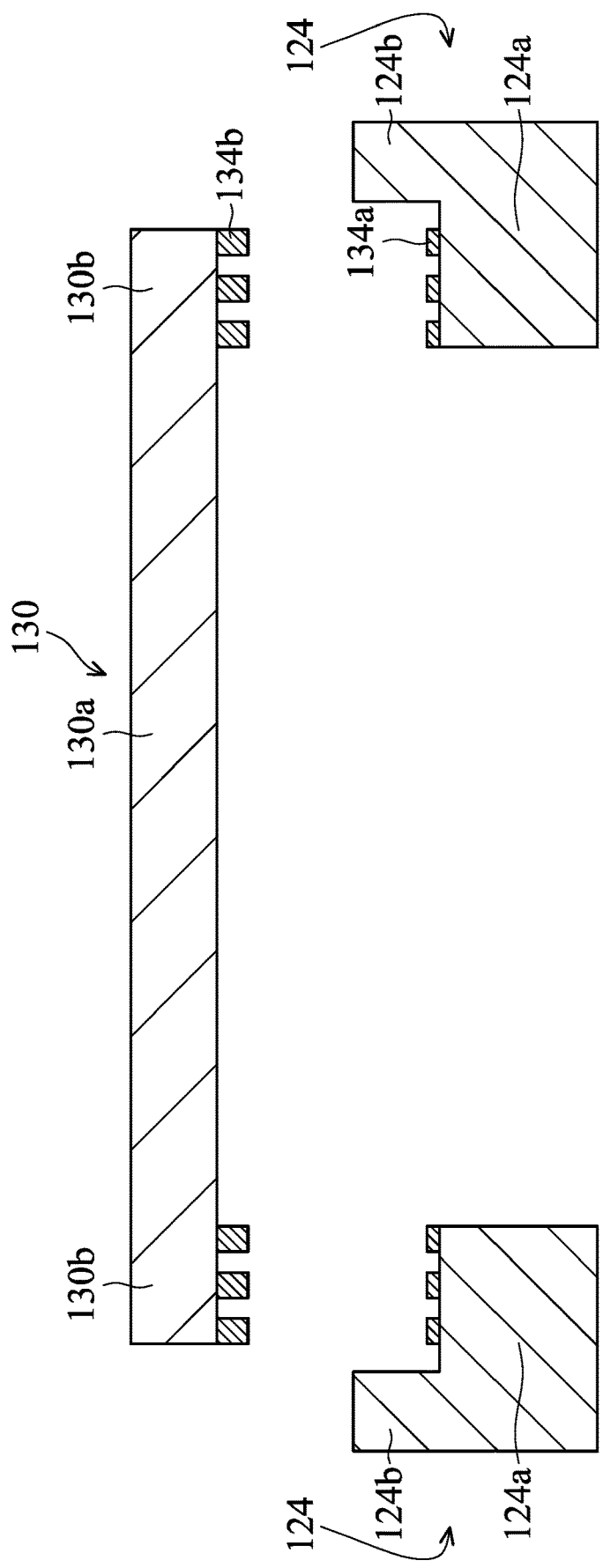
FIGS. 8A-8C are cross-sectional representations of various stages of forming a modified semiconductor package structure, in accordance with some embodiments of the disclosure.
Figure 8B:
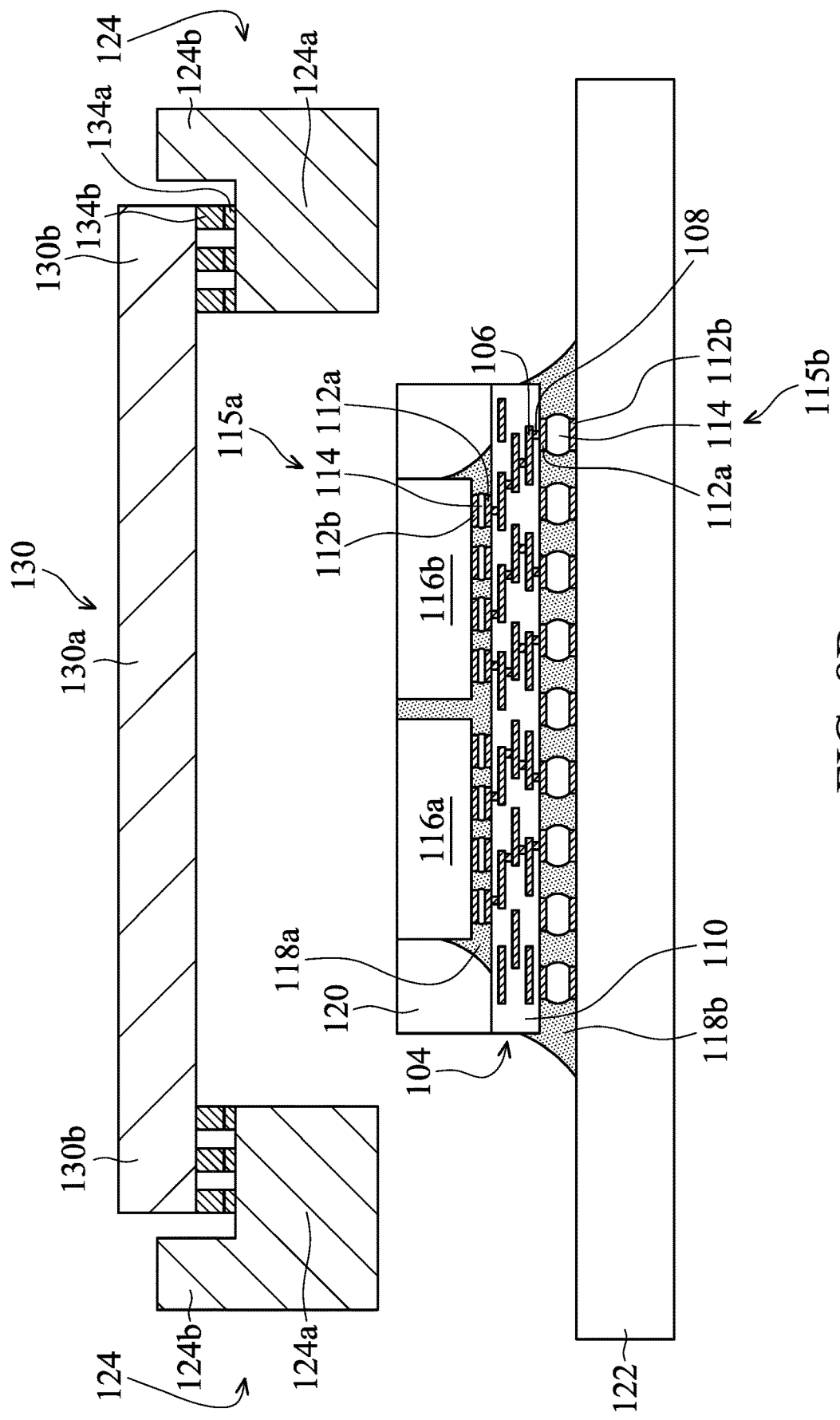
Figure 8C:
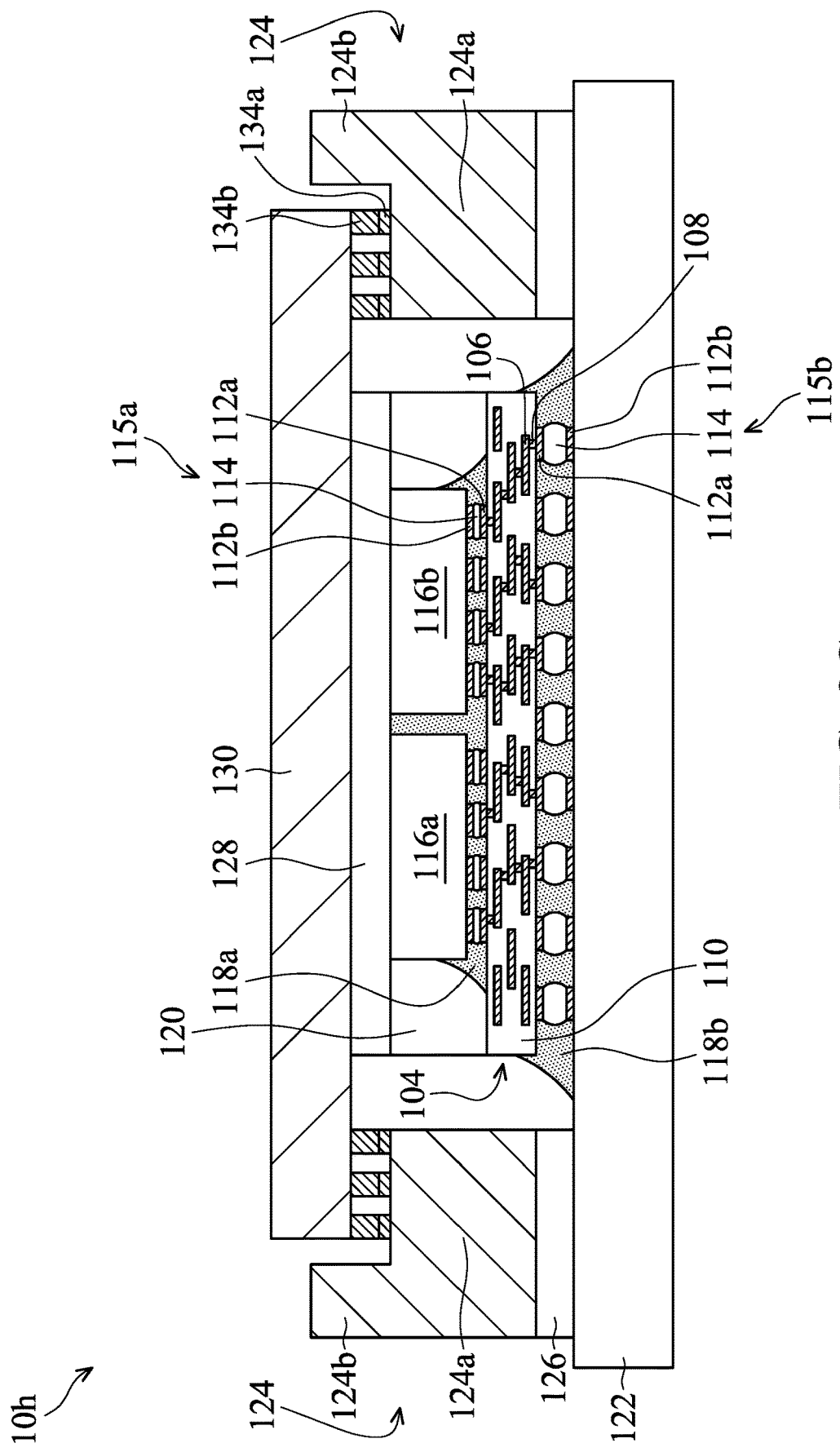

Many variations and/or modifications may be made to the embodiments of the disclosure. FIGS. 8A-8C are cross-sectional representations of various stages of forming the semiconductor package structure 10h, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 8A in accordance with some embodiments, the first bonding pad structures 134a are formed over the first heat spreader 124 before attaching the first heat spreader 124 to the package substrate 122.

As shown in FIG. 8A, the first bonding pad structures 134a are formed over the inner portion 124a of the first heat spreader 124, and the second bonding pad structures 134b are formed under the outer portion 130b of the second heat spreader 130. In some embodiments, the first bonding pad structures 134a and the second bonding pad structures 134b are bonded to the first heat spreader 124 and the second heat spreader 130 respectively before attaching the first heat spreader 124 to the package substrate 122.

Next, the first heat spreader 124 and the second heat spreader 130 are bonded with each other by the bonding pad structures 134a/134b before attaching the first heat spreader 124 to the package substrate 122, as shown in FIG. 8B in accordance with some embodiments. Since the first heat spreader 124 and the second heat spreader 130 are bonded with each other before attaching the first heat spreader 124 to the package substrate 122, the strength needed to bond the first heat spreader 124 and the second heat spreader 130 with each other may not affect the package substrate 122. Moreover, cracks of the bonding pad structures 134a/134b while bonding may be prevented.

Next, the first heat spreader 124 and the second heat spreader 130 are attached to the package substrate 122 by the adhesive layer 126, as shown in FIG. 8C in accordance with some embodiments.

By disposing discrete first heat spreader 124 and second heat spreader 130 over the dies 116a/116b and the package substrate 122, the stress in the interposer substrate 104 may be reduced. The L-shape first heat spreader 124 may help to prevent misalignment when disposing the second heat spreader 130 over the first heat spreader 124 and the dies 116a/116b. The first heat spreader 124 and the second heat spreader 130 may be attached by the bonding pad structures 134a/134b. The first heat spreader 124 and the second heat spreader 130 may be bonded before attaching the first heat spreader 124 to the package substrate 122, the strength needed to bond the first heat spreader 124 and the second heat spreader 130 with each other may not affect the package substrate 122. Moreover, cracks of the bonding pad structures 134a/134b while bonding may be prevented.

As described previously, the heat spreader over the package substrate includes discrete first heat spreader 124 and second heat spreader 130 with different coefficients of thermal expansion. The stress in the interposer substrate 104 may be reduced. The L-shape first heat spreader 124 may prevent misalignment when disposing the second heat spreader 130 over the first heat spreader 124. The first heat spreader 124 and the second heat spreader 130 may be bonded with each other by the adhesive layer 132. In the embodiments illustrated in FIG. 1F, the inner portion 124a and the outer portion 124b of the first heat spreader 124 have different thicknesses, and the mechanical strength caused by the first heat spreader 124 is modified. In the embodiments illustrated in FIGS. 2 and 5, the inner portion 130a and the outer portion 130b of the second heat spreader 130a also have different thicknesses, and the coefficients of thermal expansion with the substrate package 122 is reduced. In the embodiments illustrated in FIG. 3, the outer portion 124b of the first heat spreader 124 has a sloped sidewall. In the embodiments illustrated in FIG. 4, the second heat spreader 130 has a middle portion 130c, and stress caused by the coefficient of thermal expansion difference between the dies 116a/116b and the first heat spreader 124 may be reduced.

In the embodiments illustrated in FIG. 6, the inner portion 124a and the outer portion 124b have the same thickness, and the stress may be reduced. In the embodiments illustrated in FIGS. 7A-7B, the first heat spreader 124 and the second heat spreader 130 are bonded with each other by the bonding structures 134a/134b. In the embodiments illustrated in FIGS. 8A-8C, the first heat spreader 124 and the second heat spreader 130 are bonded before attaching to the package substrate 122, and bonding strength may not affect the package substrate 122.

Embodiments of a semiconductor package structure and a method for forming the same are provided. The semiconductor package structure includes forming discrete heat spreader with different coefficients of thermal expansion. The stress in the interposer substrate may be reduced. The L-shape heat spreader may prevent misalignment when disposing the top heat spreader. The L-shape heat spreader and the top heat spreader may be attached by an adhesive layer or bonding pads.

In some embodiments, a semiconductor package structure is provided. A semiconductor package structure includes an interposer substrate formed over a package substrate. The semiconductor package structure also includes a die disposed over the interposer substrate. The semiconductor package structure also includes a first heat spreader disposed over the package substrate. The semiconductor package structure also includes a second heat spreader disposed over the die and connected to the first heat spreader. The coefficient of thermal expansion (CTE) of the first heat spreader and the coefficient of thermal expansion of the second heat spreader are different.

In some embodiments, a semiconductor package structure is provided. The semiconductor package structure includes A semiconductor package structure includes an interposer substrate disposed over a package substrate. The semiconductor package structure also includes a first heat spreader attached to the package substrate. The semiconductor package structure also includes an attaching structure formed over the first heat spreader. The semiconductor package structure also includes a die disposed over the interposer substrate. The semiconductor package structure also includes a second heat spreader attached to the die and the attaching structure. The first heat spreader and the second heat spreader are made of different materials.

In some embodiments, a method for forming a semiconductor package structure is provided. The method for forming a semiconductor package structure includes forming an interposer substrate over a carrier substrate. The method for forming a semiconductor package structure also includes disposing a die over the interposer substrate. The method for forming a semiconductor package structure also includes removing the carrier substrate from the interposer substrate. The method for forming a semiconductor package structure also includes disposing the interposer substrate and the die over a package substrate. The method for forming a semiconductor package structure also includes attaching a first heat spreader over the package substrate surrounding the interposer substrate. The method for forming a semiconductor package structure also includes attaching a second heat spreader over the die and to the first heat spreader using an attaching structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor package structure, comprising:
forming an interposer substrate over a carrier substrate;
disposing a die over the interposer substrate;
removing the carrier substrate from the interposer substrate;
disposing the interposer substrate and the die over a package substrate;
attaching a first heat spreader over the package substrate surrounding the interposer substrate; and
attaching a second heat spreader over the die and to the first heat spreader using an attaching structure.

2. The method for forming a semiconductor package structure as claimed in claim 1, further comprising:
forming first pad structures over the first heat spreader;
forming second pad structures under the second heat spreader; and
bonding the first pad structures and the second pad structures to attach the first heat spreader and the second heat spreader.

3. The method for forming a semiconductor package structure as claimed in claim 2, wherein the first pad structures and the second pad structures are bonded to each other before attaching the first heat spreader over the package substrate.

4. The method for forming a semiconductor package structure as claimed in claim 1, wherein the attaching structure between the second heat spreader and the first heat spreader comprises an adhesive layer.

5. The method for forming a semiconductor package structure as claimed in claim 4, wherein a top surface of an outer portion of the first heat spreader is substantially level with a bottom surface of the adhesive layer.

6. The method for forming a semiconductor package structure as claimed in claim 1, wherein the second heat spreader has an inner portion over the die, an outer portion over the first heat spreader, and a middle portion between the inner portion and the outer portion, and the middle portion is thinner than both the inner portion and the outer portion.

7. The method for forming a semiconductor package structure as claimed in claim 1, further comprising:
forming an underfill layer between the interposer substrate and the die;
forming an encapsulating layer surrounding the die and the underfill layer; and
performing a planarization process to expose a top surface of the die, a top surface of the underfill layer, and a top surface of the encapsulating layer.

8. The method for forming a semiconductor package structure as claimed in claim 7, further comprising forming a thermal interface material (TIM) structure covering the top surface of the die, the top surface of the underfill layer, and the top surface of the encapsulating layer,
wherein the second heat spreader is attached over the die with the TIM structure between the second heat spreader and the die.

9. A method for forming a semiconductor package structure, comprising:
disposing a die over an interposer substrate;
forming an encapsulating layer over the interposer substrate and surrounding the die;
disposing the interposer substrate over a package substrate;
attaching a bottom heat spreader to the package substrate; and
attaching a top heat spreader to the bottom heat spreader on opposite sides of the interposer substrate,
wherein a coefficient of thermal expansion (CTE) of the top heat spreader and a coefficient of thermal expansion of the bottom heat spreader are different.

10. The method for forming a semiconductor package structure as claimed in claim 9, wherein the top heat spreader is attached to the bottom heat spreader after the bottom heat spreader is attached to the package substrate.

11. The method for forming a semiconductor package structure as claimed in claim 9, wherein the bottom heat spreader has a first inner portion adjacent to the interposer substrate and a first outer portion adjacent to an edge of the package substrate.

12. The method for forming a semiconductor package structure as claimed in claim 11, wherein the first outer portion of the bottom heat spreader has a sloped sidewall.

13. The method for forming a semiconductor package structure as claimed in claim 11, wherein a first distance between a sidewall of the first inner portion of the bottom heat spreader and a sidewall of the interposer substrate is greater than 0 µm.

14. The method for forming a semiconductor package structure as claimed in claim 13, wherein the first distance is greater than a second distance between a second inner portion of the top heat spreader and the sidewall of the first inner portion of the bottom heat spreader.

15. The method for forming a semiconductor package structure as claimed in claim 14, wherein a bottom surface of the second inner portion of the top heat spreader is lower than a bottom surface of a second outer portion of the top heat spreader.

16. A method for forming a semiconductor package structure, comprising:
disposing dies over an interposer substrate;
after disposing the dies, bonding the interposer substrate to a package substrate;
forming a first heat spreader over the package substrate with a first attaching structure between the first heat spreader and the package substrate; and
forming a second heat spreader over the first heat spreader with a second attaching structure between the first heat spreader and the second heat spreader,
wherein the second heat spreader is spaced apart from the first heat spreader by the second attaching structure, and the first heat spreader extends underneath the second heat spreader and extends above a lowest surface of the second heat spreader.

17. The method for forming a semiconductor package structure as claimed in claim 16, wherein the first heat spreader is arranged as discontinuous strips surrounding the second heat spreader.

18. The method for forming a semiconductor package structure as claimed in claim 16, wherein the first heat spreader is in a ring shape surrounding the second heat spreader and the interposer substrate from a top view.

19. The method for forming a semiconductor package structure as claimed in claim 16, wherein the second heat spreader is formed over the dies with a thermal interface material (TIM) structure between the second heat spreader and the dies, and wherein the TIM structure is spaced apart from the second attaching structure.

20. The method for forming a semiconductor package structure as claimed in claim 19, wherein the first heat spreader has a top surface above a top surface of the TIM structure.

\* \* \* \* \*